United States Patent [19]
Wang et al.

[11] Patent Number: 5,579,510
[45] Date of Patent: Nov. 26, 1996

[54] METHOD AND STRUCTURE FOR USE IN STATIC TIMING VERIFICATION OF SYNCHRONOUS CIRCUITS

[75] Inventors: Albert R. Wang, Fremont; Richard Rudell, Los Gatos, both of Calif.

[73] Assignee: Synopsys, Inc., Mountain View, Calif.

[21] Appl. No.: 95,627

[22] Filed: Jul. 21, 1993

[51] Int. Cl.$^6$ ..................... G06F 17/00
[52] U.S. Cl. .......... 395/500; 364/488; 364/489; 364/578
[58] Field of Search .................. 364/488, 489, 364/490, 491, 578; 395/500, 550; 375/355; 327/141, 185, 261

[56] References Cited

U.S. PATENT DOCUMENTS

| | | | |
|---|---|---|---|
| 5,095,454 | 3/1992 | Huang | 364/578 |
| 5,168,455 | 12/1992 | Hooper | 364/490 |
| 5,191,541 | 3/1993 | Landman et al. | 364/489 |
| 5,210,700 | 5/1993 | Tom | 364/489 |
| 5,218,551 | 6/1993 | Agrawal et al. | 364/491 |
| 5,278,769 | 1/1994 | Bair et al. | 364/490 |
| 5,381,524 | 1/1995 | Lewis et al. | 395/161 |
| 5,406,497 | 4/1995 | Altheimer et al. | 364/489 |

Primary Examiner—Kevin J. Teska
Assistant Examiner—Tan Nguyen
Attorney, Agent, or Firm—Skjerven, Morrill, MacPherson, Franklin & Friel; Forrest E. Gunnison

[57] ABSTRACT

A universal synchronization element is used in a static timing verification system to represent selected combinational primitive elements, synchronous primitive elements and external primitive elements in the user's synchronous digital circuit. Each of these digital circuit element in a user's digital circuit design is represented by a corresponding universal synchronization element having a propagation time characteristic equivalent to the digital circuit element and a stable time characteristic equivalent to the digital circuit element. The propagation and stable time characteristics are defined in relation to a clock signal for the digital circuit element in the user's circuit that the universal synchronization element represents. The universal synchronization element does not a fixed timing relationship between the signals on its input and output terminals. The adjustment of stable interval starting and end times and the propagation interval starting and end times is sufficient to represent the timing characteristics of circuit element with the universal synchronization element of this invention.

45 Claims, 6 Drawing Sheets

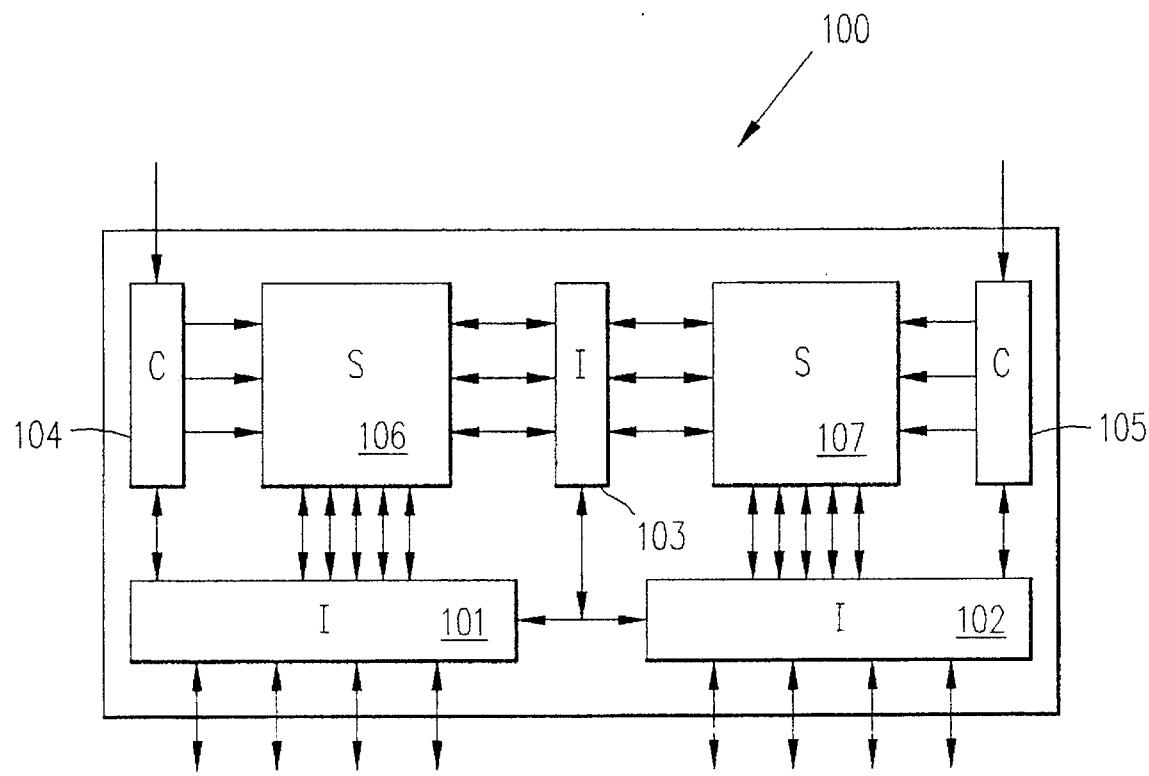
FIG. 1
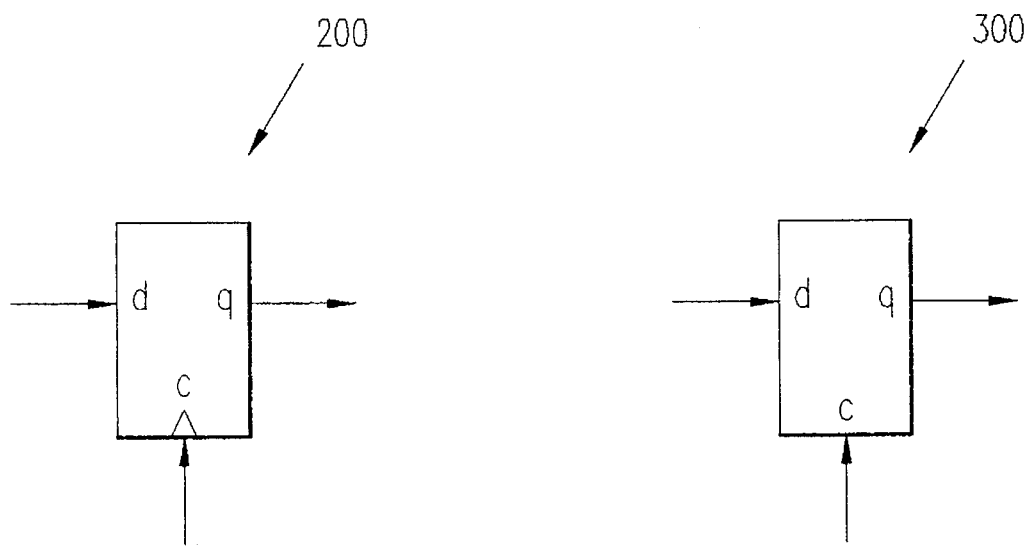
FIG. 2
FIG. 3

METHOD AND STRUCTURE FOR USE IN STATIC TIMING VERIFICATION OF SYNCHRONOUS CIRCUITS

BACKGROUND OF THE INVENTION

1. Field of the Invention

This invention relates generally to timing verification of synchronous digital circuits and in particular to a generalized structure with a propagation time interval and a stable time interval that is used to represent synchronous primitive elements, selected combinational elements, i.e., combinational elements with either synchronous timing behavior, or synchronous timing constraints, and external primitive elements in a synchronous digital circuit in static timing verification thereby providing a new capability in static timing verification.

2. Description of the Related Art

Digital circuits frequently include both combinational elements and synchronization elements. Combinational elements implement Boolean logic equations. A combinational element has zero or more input terminals and a single output terminal. The output signal level of a combinational element is determined solely by the present level of the input signals. Examples of combinational primitive elements include AND gates, OR gates, and inverters.

Synchronization elements typically have a clock input terminal, a data input terminal, an output terminal and up to two asynchronous control input terminals (set and reset). The output signal of a synchronization element depends not only on the present level of the input signals, but also on the past history of the input signals. Furthermore, the output signal of a synchronization element is updated only during certain time intervals which are controlled by another input signal called a clock signal. Synchronization elements include level-sensitive latches and edge-triggered flip-flops. More complex synchronization elements, such as a J-K edge triggered flip-flops, master-slave two-clock flip-flops, or a multi-bit register can be modeled as net-lists of synchronization and combinational elements.

Typically, the target technology used to implement synchronization elements imposes some timing constraints on the synchronization elements so as to ensure proper data transfer to and from the elements. In particular, the latest time the input data signal must become stable, i.e., a "set-up time," and the earliest time the input data can change again, i.e., a "hold time," are typically dictated by the target technology.

A block diagram of a typical digital system 100 that includes combinational and synchronization elements, e.g., a simple application specific integrated circuit (ASIC), is illustrated in FIG. 1. This digital system includes interface logic 101, 102, 103, clock generation circuitry 104, 105 and synchronous digital circuits 106, 107. Interface logic 101, 102, 103 is used to transport signals on and off the integrated circuit. For a purely synchronous digital circuit, interface logic 101, 102, 103 includes merely a pad and its associated logic, for example, pad protection, signal interface level adjustment, and signal conditioning logic. However, for most digital systems, at least some of the chip interface signals are asynchronous and so the interface circuit also includes asynchronous digital circuits which synchronize signals for use in digital system 100.

All periodic signals in digital system 100 are output signals of clock generation circuit 104, 105. For example, clock frequency dividers take a single fifty-percent duty cycle clock, and generate the required on-chip clock signals. Clock generation circuit 104, 105 typically includes analog components such as phase-lock loop circuits and also typically uses asynchronous logic.

Simply stated, the synchronous portion of digital system 100 is the rest of the circuitry in digital system 100. Specifically, synchronous digital circuits 106, 107 are constructed from the combinational elements and the synchronization elements described above.

Typically, in designing a digital system such as system 100, a designer provides Boolean expressions or an equivalent representation of the system and uses a computer process to generate the circuitry for the system. One problem in the design process is verification of (i) the speed characteristics and (ii) the timing characteristics of the circuitry. Timing verification looks at the time delay along all data paths within the circuit and determines whether the time delay is either too long or too short In the simplest case, timing verification takes the specific requirements for the circuit, e.g., the system clock runs at 50 MHz, and tells the user whether the digital circuit functions correctly. In a more general timing verification, an indication of where the circuit design is failing is provided to assist the designer or automatic synthesis tool in correcting the timing failures.

Two main approaches are used for timing verification during the digital circuit design process, static timing verification and dynamic timing verification. Dynamic timing verification uses vectors provided by the designer and performs logic simulation with timing values to verify the timing behavior of the circuit. Dynamic timing verification is difficult to use because the designer must provide the input signal patterns and analyze the output wave forms to verify that the circuit functions correctly at the intended speed. Dynamic verification has the advantage that the timing behavior of any design can be analyzed and dynamic verification offers a high degree of accuracy by correctly modeling the Boolean interaction between signals.

However, the quality of the dynamic timing verification is limited by the input stimuli provided by the designer. If the designer does not correctly specify the input condition that triggers the worst-case delay path in the circuit, the dynamic timing analysis may result in an optimistic value for the circuit speed. Finally, dynamic timing verification requires extensive computer resources because a large number of input signal patterns must be simulated to offer a high degree of confidence in the results.

Static timing verification typically uses a formal analysis to verify the digital circuit timing behavior. This analysis finds the longest path in a directed acyclic graph. Static timing verification offers a more accurate picture of the digital circuit timing behavior than dynamic timing analysis because this verification implicitly considers all possible input signal patterns. However, since static timing verification ignores signal dependency in the digital circuit and considers all possible input signal patterns including signal patterns which never really occur, static timing verification timing delays may be pessimistic. Also, static timing verification is usually not applicable to all digital designs, e.g., asynchronous circuits.

Static timing verification has traditionally been limited to so called synchronous designs and even then to a limited subset of what a designer considers to be a synchronous design. Specifically, only circuit elements which can be accurately represented by one of the ideal elements that are available in the static verification system can be reliably characterized in the static timing verification. For example, if the static timing verification system includes only an ideal positive edge triggered D-type flip-flop and an ideal positive level sensitive D-type latch, only these two synchronous elements and other synchronous elements that can be accurately represented using these two ideal synchronous elements can be accurately processed by the static timing verification. Further limitations of this approach are discussed below.

While static timing verification may provide superior results with more limited resources in comparison to dynamic timing verification, static timing verification is typically considered difficult to use. The complexity of static timing verification is further demonstrated by first considering the operation of synchronization elements in more detail.

In synchronous digital circuit design, latches and flip-flops under the control of global clocks are used to synchronize signals and sequence the computation of the signals. For example, FIG. 2 is a block diagram of a positive edge-triggered D-type flip-flop 200 with a data input terminal "d", a data output terminal "q", and a clock terminal "c". Flip-flop 200 transmits the input data signal on data input terminal "d" to data output terminal "q" under the control of the clock signal on clock terminal "c". Specifically, the transmission occurs around the rising edge of the clock signal and so flip-flop 200 is referred to as a "positive edge triggered flip-flop."

To assure proper operation of flip-flop 200, the input signal on data input terminal "d" must be stable a short time before the initiation of the rising clock edge. This requirement is referred to as the "setup requirement." In addition, the input signal must remain stable for a short time after the initiation of the rising clock edge. This requirement is referred to as the "hold requirement." The signal on output terminal "q" is not guaranteed valid until after the hold requirement, sometimes referred to as the "hold time".

When the setup and hold requirements are met, the data signal is said to be "synchronized" by flip-flop 200 at the rising edge of the clock signal. Thus, the timing constraints associated with flip-flop 200 are:

(i) a specific edge of the clock signal;

(ii) a setup requirement and the associated clock edge; and (iii) a hold requirement and the associated clock edge.

In some cases, signals are not synchronized to a clock edge, but rather to a time interval. A block diagram of a device 300 that synchronizes signals to a time interval, a positive level-sensitive D-type latch, is illustrated in FIG. 3. Latch 300 also has a data input terminal "d", a data output terminal "q", and a clock terminal "c", which is typically referred to as an "enable" terminal. However, unlike flip-flop 200, latch 300 allows the input data signal on input terminal "d" to propagate to output terminal "q" any time the signal on clock terminal "c" is active, e.g., high, which is the basis for the name "positive-level sensitive latch."

When the clock signal on clock terminal "c" goes low, the output signal on terminal "q" remains at the level just before the initiation of the falling clock edge. Thus, to ensure proper operation of latch 300, the input data signal must be stable a short time before a falling clock edge, the "setup requirement", and the input data signal must remain stable until a short time after the falling clock edge, the "hold requirement". The signal on output terminal "q" is not guaranteed valid until after the hold requirement, sometimes referred to as the "hold time".

When the setup and hold requirements are met, the data signal is said to be "synchronized" by latch 300 to an interval of time. Thus, the timing constraints associated with latch 300 are:

(i) an interval of time during which data can propagate from the input data terminal to the output data terminal;

(ii) a setup requirement and the associated clock edge; and (iii) a hold requirement and the associated clock edge.

A static timing verification system is a computer based process to which a circuit designer supplies a synchronous digital circuit. This computer process analyzes the timing characteristics of the synchronous digital circuit for all possible input signals to the circuit. The goal of static timing verification system is to assure that signals are transmitted properly in the synchronous digital circuit, or to provide an indication of where the circuit may fail so as to guide the designer in correcting the timing failure.

Specifically, the static timing verification system analyzes each data path in the synchronous digital circuit. A typical data path starts at the data output terminal of a synchronization element and ends at the data input terminal of another synchronization element. FIG. 4 is a representation of one data path. Latches 400A, 400B, and 400C each generate an output signal to combinational logic circuit 410 which in turn generates an input signal to latch 400D. Other data paths start, for example, either (i) at an input port and end at the data input terminal of a synchronization element, or (ii) at the data output terminal of a synchronization element and end at an output port, or (iii) at an input port and end at an output port.

In the static timing verification system, the designer-specific synchronous digital circuit behavior is reduced to (i) when the output signals of ideal latches 400A, 400B, and 400C are stable, i.e., after the hold times for the corresponding physical synchronous latches in the designer's circuit, and (ii) when the signal at the input terminal of ideal latch 400D is required to be stable, i.e., before the setup time of the physical synchronous latch corresponding to ideal latch 400D in the designer's circuit. Such requirements are generally called "timing constraints." The static timing verification system makes sure that all such timing constraints are met or reports why a particular constraint can not be met and by how much. Thus, the static timing verification system is a computer process that analyzes the timing characteristics of a synchronous digital circuit without requiring the time and expense of building the actual circuit and performing timing tests.

For a static timing verification system to be useful for a wide variety of digital circuits, the static timing verification system designer must anticipate all circuit elements in users' synchronous digital circuits for which the static timing verification system will be used as well as special conditions in the users' synchronous digital circuits that affect the timing characteristics. The static timing verification system designer must provide in the static timing verification system a way to convert each circuit element to a corresponding ideal element. There are two problems with this approach.

First, the designer must anticipate all types of synchronous elements and must modify the static timing verification system whenever a new synchronous element is introduced. Since the static timing verification system is a computer process that is controlled by software, this typically results in unstable software, and possible erroneous interpretation of the synchronous behavior of the new synchronous element.

Second, there are some circuit elements that can not be represented by the set of ideal synchronous elements that are typically used in a static timing verification system. Thus, the current practice in static timing verification leads to erroneous results when a new circuit element is not properly incorporated into the static timing verification system. In some cases, a user's synchronous digital circuit may not be amendable to static timing verification because the set of ideal synchronous circuit elements provided cannot be used to represent one or more circuit elements in the user's circuit.

Typically, correct and accurate static timing verification for (i) combination elements with synchronous timing behavior, such as clocked-gates and gated-clocks, (ii) external primitive elements, such as input ports and output ports, and (iii) other synchronous primitive elements, such as random-access memory(RAM), read-only memory(ROM), is not considered in most references that discuss static timing verification. However, if circuit elements such as these are not treated properly, the results of the static timing verification are at best questionable. For this reason, despite all the benefits of static timing verification, the consensus opinion is generally that dynamic timing verification is the best way to obtain accurate reliable results timing results.

SUMMARY OF THE INVENTION

In accordance with this invention, a novel universal synchronization element is used in a static timing verification system to represent circuit elements in a synchronous digital circuit. In the method of this invention, each synchronous circuit element and each combinational circuit element having either synchronous timing behavior or synchronous timing constraints in the synchronous digital circuit are represented by a universal synchronization element having a signal propagation time characteristic equivalent to the signal propagation time characteristic of that circuit element and a signal stable time characteristic equivalent to the signal stable time characteristic of that circuit element. The signal propagation and stable time characteristics are defined in relation to a clock signal for the circuit element in the user's circuit that the universal synchronization element of this invention replaces.

Specifically, the universal synchronization element of this invention includes a propagation time means and a stable time means, which are used to adjust the propagation time characteristic and the stable time characteristic so that the universal synchronization element has the same timing characteristics as the circuit element represented by the universal synchronization element in the static timing verification. The universal synchronization element has an input terminal that provides the input signal to the propagation and stable time means. A clock terminal is driven by the output signal of a buffer which in turn is driven by the clock signal for the circuit element being replaced. The buffered clock signal may be connected to an output terminal "O" and is provided to the propagation and stable time means. The propagation and stable time means are also connected to terminal "Q", which also may be connected to output terminal "O".

The universal synchronization element does not have a fixed timing relationship between the signals on the input terminal, output terminal "O", and the clock terminal. Rather, the timing relationship of these signals is determined by the stable time means and the propagation time means. The stable time means defines a stable start time at time "u" and a stable end time at time "U" while the propagation time means defines a propagation start time at time "t" and a propagation end time at time "T." All of these times are defined in relation to clock edges of the clock signal. The adjustment of stable internal starting and end times and the propagation internal starting and end times is sufficient to represent the timing characteristics of synchronous primitive elements, combinational primitive elements, and external primitive elements with the universal synchronization element of this invention.

The universal synchronization element of this invention greatly simplifies static timing verification because the universal synchronization element unifies the characterization of the various circuit elements and subsumes the existing methods based upon a set of ideal synchronous elements. With universal synchronization element of this invention, the static timing verification system does not require software reprogramming either when a new synchronous element is introduced, or when new combinational circuit structures require checking.

Also, the prior art problems associated with new circuit elements, which could not be related to the set of ideal synchronous elements upon which the static timing verification program was based, have been eliminated. According to the principles of this invention, the circuit designer provides the propagation time means and the stable time means with the appropriate timing characteristics for each new circuit element in the design and thereby uses the universal synchronization element of this invention to represent the new circuit elements.

To use universal synchronization element of this invention to represent an edge-triggered D-type flip-flop, the propagation time means is configured so that signal propagation start time t-FF, which is the instant in time defined by an edge of the clock signal going in a first direction, e.g., the rising edge of the clock signal, and propagation signal end time T-FF, which is the instant in time defined by a subsequent edge of the clock signal going in a second direction opposite to the first direction, e.g., the next falling edge of the clock signal, define a time interval equivalent to the hold interval of the flip-flop. Consequently, the universal synchronization element permits the input signal to propagate to output terminal Q and in turn to output terminal O only during the time interval between propagation start time t-FF and propagation end time T-FF. The stable time means is configured so that the setup time plus the hold time of the flip-flop corresponds to the time interval between stable start time u-FF and stable end time U-FF, i.e., the time just before the rising clock edge to just after the rising clock edge.

To use the universal synchronization element of this invention to represent a level-sensitive latch, the propagation time means is configured so that the signal propagation start time is defined by an edge of a clock signal going in a first direction, e.g., a rising edge to the clock signal, and the signal propagation end time is defined by a subsequent edge of the clock signal going in a second direction wherein second direction is opposite to said first direction, e.g. the next falling edge of the clock signal. During this time interval, the input signal to the universal synchronization element propagates to output terminal Q and in turn to output terminal O. The stable time means is configured so that the setup time interval plus the hold time interval of the level-sensitive latch corresponds to the time interval between stable start time u-FF and stable end time U-FF, i.e., the time just before the falling edge of the clock signal to the time just after the falling edge when the input signal on the input terminal of the universal synchronization element is latched on output terminal Q.

In the method of this invention, combinational primitive logic elements, which have a clock signal on one input terminal and a data signal on another input terminal and which generate an output signal that affects the timing performance of the synchronous digital circuit, i.e., selected combinational logic elements, are represented in the static timing verification using a signal propagation time interval and a signal stable time interval. In general, these combinational primitive logic elements have either synchronous timing behavior, i.e., the generation of the output signal is related to a clock signal, or synchronous timing constraints. The function of these special combinational logic elements is determined by whether an input pin of a synchronous primitive element is in the transitive fanout of the particular combinational logic unit.

If an input pin of a synchronous primitive element is in the transitive fanout of the particular combinational logic element, the output signal of that combinational logic element is a data signal that is referred to as a clocked gate signal or simply a clocked gate. Conversely, if an input pin of a synchronous primitive element is not in the transitive fanout of the particular combinational logic element, the output signal of that combinational logic element is a clock signal that is referred to as a gated-clock signal or simply a gated clock. The universal synchronization element is utilized to represent both of these special combinational primitive logic elements.

Finally, external primitive elements, such as input ports and output ports are also represented in the method of this invention in a static timing verification system by using a signal propagation time interval and a signal stable time interval.

BRIEF DESCRIPTION OF THE DRAWINGS

FIG. 1 is a block diagram of a simple application specific integrated circuit with logic interface circuits, clock generation circuits and synchronous digital circuits.

FIG. 2 is a block diagram of a prior art positive edge-triggered D-type flip-flop.

FIG. 3 is a block diagram of a prior art positive level-sensitive D-type latch.

DETAILED DESCRIPTION

Figure 4:
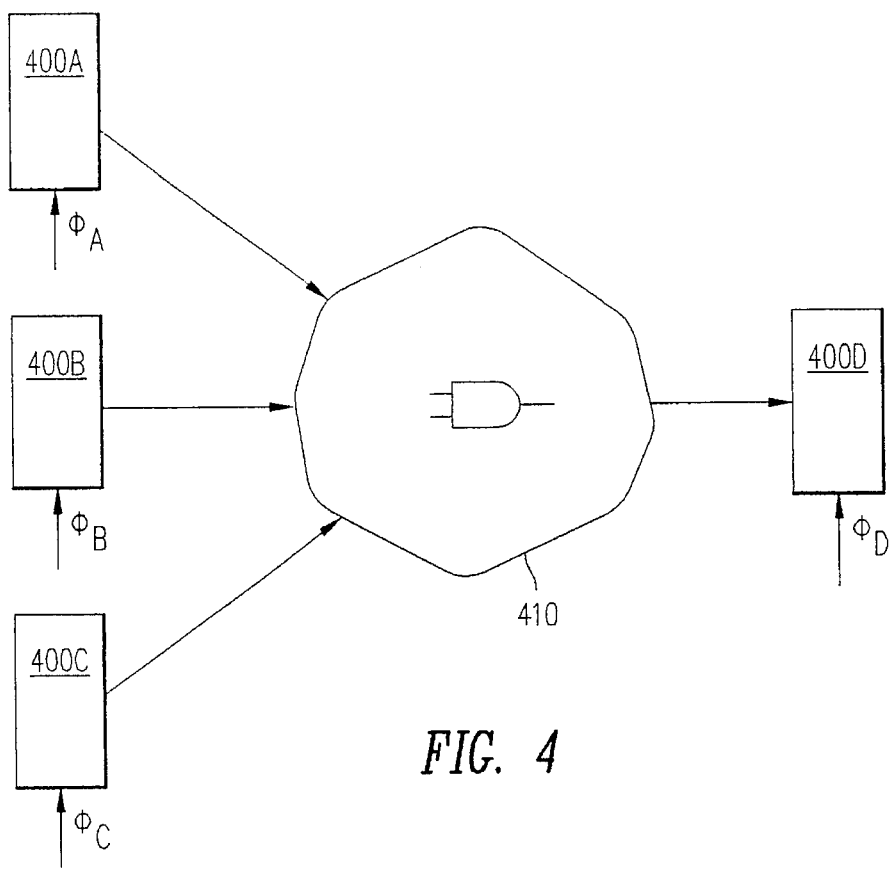
FIG. 4 is a block diagram illustrating a data path as defined herein.

In accordance with this invention, a static timing verification system uses a novel method to represent primitive external elements, combinational primitive elements having either synchronous timing behavior or synchronous timing constraints, and synchronous primitive elements, collectively referred to as circuit elements, in a user's synchronous digital circuit. Each of these circuit elements in a user's synchronous digital circuit is represented by the static timing verification system with a single element, referred to herein as "a universal synchronization element," that has a signal propagation time characteristic and a signal stable time characteristic, hereinafter "propagation time characteristic" and "stable time characteristic," respectively. As described more completely below, the propagation and stable time characteristics are defined in relation to a clock signal for the original circuit element. Hence, unlike prior static timing verification systems where each different physical synchronous circuit element had a corresponding ideal synchronous element, according to the principles of this invention, a single universal synchronization element is used to represent synchronous primitive elements as well as external primitive elements and combinational primitive elements having either synchronous timing behavior or synchronous timing constraints. Such combinational primitive elements are sometimes referred to herein simply as "selected combinational elements."

Even though some of the circuit elements in the user's circuit do not function like a normal latch or a normal flip-flop, the timing behavior of these circuit elements is fully represented by the propagation and stable time characteristics of the universal synchronization element of this invention. Thus, the utilization of a propagation time characteristic and a stable time characteristic provides a new and enhanced capability in static timing verification because it is no longer necessary (i) to ignore certain circuit elements in a user's digital circuit and (ii) to modify the software comprising the static timing verification system when a new synchronous element is used. Rather, in the method of this invention only the propagation and stable time characteristics for a new circuit element must be defined and provided to the universal synchronization element of this invention.

According to the principles of this invention, in a static timing verification, a single universal synchronization element is utilized for all synchronous primitive elements of a synchronous digital circuit as well as external primitive elements and selected combinational elements. Therefore, in comparison to prior art systems that had a different idealized synchronous element for each different synchronous element, the universal synchronization element of this invention reduces the complexity of the static timing verification process while providing a new level of accuracy and capability in static timing verification systems.

Figure 5:
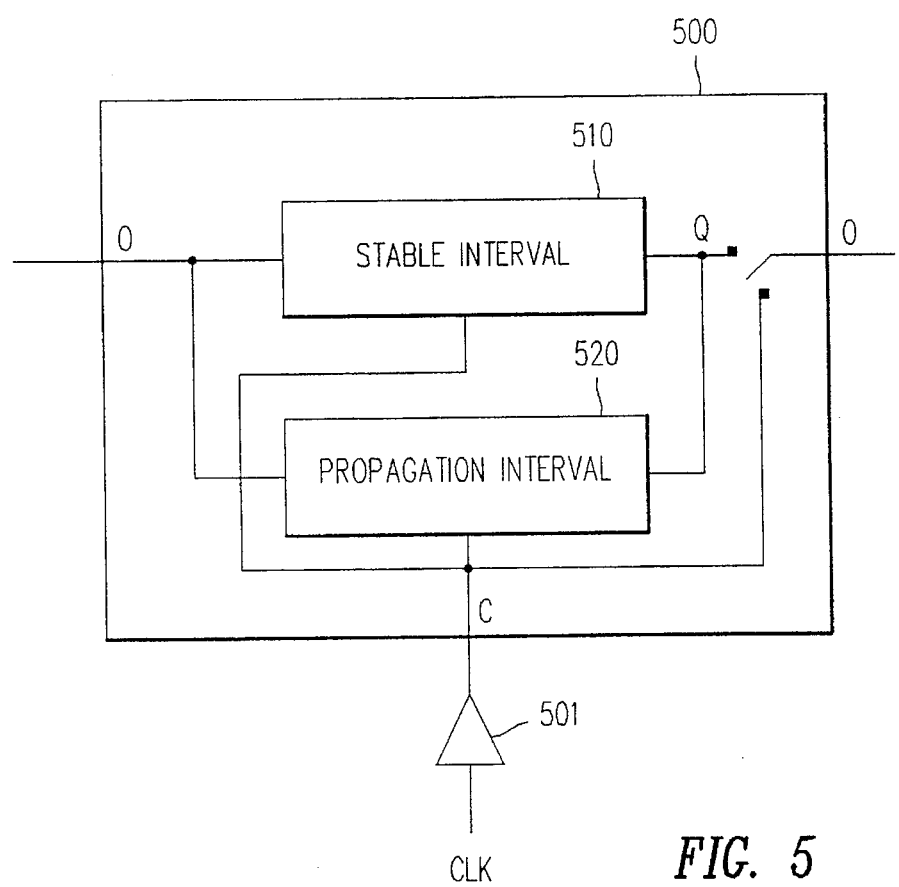
FIG. 5 is block diagram illustrating the key features of the universal synchronization element of this invention.

Universal synchronization element 500 (FIG. 5) of this invention includes a stable time means 510 and a propagation time means 520, which determine the timing characteristics of universal synchronization element 500. For example, if the static timing verification system uses universal synchronization element 500 to represent a circuit element in the user's synchronous digital circuit that has only a propagation time characteristic, stable time means 510 sets the stable time characteristic to a single instance in time so that the stable characteristic is always satisfied. As explained more completely below, universal synchronization element 500 of this invention may be used to represent flip-flops, latches, clocked-gates, gated-clocks, input ports, and output ports as well as other circuit elements such as RAMs and ROMs.

Universal synchronization element 500 of this invention greatly simplifies static timing verification because universal synchronization element 500 unifies the characterization of the various circuit elements and subsumes the existing methods based upon a set of ideal synchronous elements. With universal synchronization element 500 of this invention, the static timing verification system does not require software reprogramming either when a new synchronous element is introduced, or when new combinational circuit structures require checking.

Also, the prior art problems associated with new circuit elements, which could not be related to the set of ideal synchronous elements upon which the static timing verification program was based, have been eliminated. According to the principles of this invention, the circuit designer provides the propagation time and the stable time characteristics for each new circuit element in the design and thereby uses the universal synchronization element of this invention to represent the new circuit elements.

Universal synchronization element 500 has an input terminal D, an output terminal O, and a clock terminal C that is driven by a buffer 501. As explained more completely below, output terminal O may be driven by either the signal on output terminal Q or the output signal of buffer 501. However, universal synchronization element 500 does not have a fixed timing relationship between the signals on input terminal D, output terminal O, and clock terminal C. Rather, the timing relationship of these signals is determined by stable time means 510 and propagation time means 520. Stable time means 510 defines a starting time "u" and an end time "U" and during the time interval between these times, the signal must be stable, while propagation time means 520 defines a starting time "t" and an end time "T" and during this time interval, the input signal propagates from input terminal D to output terminal Q. All of these times are defined relative to an edge or edges of the clock signal. As explained more completely below, adjustment of the stable and propagation times with respect to a clock edge is sufficient to represent any synchronous primitive element, external primitive elements, and selected combinational primitive elements with the universal synchronization element 500 of this invention.

Prior to considering the use and operation of universal synchronization element 500 in the method of this invention in further detail. Several definitions are given below so as to clearly specify the terms used in describing the use and operation of universal synchronization element 500.

Herein, a "digital circuit" is a directed acyclic graph of "primitive elements", which is represented with a single level of hierarchy. The "primitive elements" include: (a) external primitive elements, e.g., input ports and output ports; (b) combinational primitive elements which each have one or two data input pins and a single output pin, e.g., a two-input terminal AND gate, a two-input terminal OR gate, and an invertor; (c) synchronous primitive elements which each have a single data input pin, a single clock input pin, and a single data output pin, e.g., a negative level-sensitive latch, a positive level-sensitive latch, a negative edge-triggered flip-flop, and a positive edge-triggered flip-flop. If a circuit in a particular technology is defined in terms of primitive elements other than those defined herein, primitive elements for that technology can be composed of these primitive elements recursively using the well-known technique of hierarchy and composition.

Herein, a subset of the input ports are designated as clock input ports, which represent all of the periodic signals in the digital circuit. The above definitions are illustrative only of the principles of this invention and are not intended to limit the invention to the particular primitive elements described. In view of this disclosure, those skilled in the art can extend the definitions to include more general sets of primitive elements including, for example, multiple output primitive elements with arbitrary levels of hierarchy. Such extensions do not change the nature or use of this invention.

A "synchronous digital circuit" is a digital circuit which, in addition to the above conditions, satisfies the following conditions:

a) every cycle in the synchronous digital circuit contains at least one latch; and b) the frequencies of the clock input signals are harmonically related, i.e., there is a single base period over which all clock waveforms repeat and the clock waveforms have a known phase relationship.

In the synchronous digital circuit, every signal is classified as either a data signal or a clock signal. Specifically, input ports, which are not clock input ports, supply data signals. Input ports, which are clock input ports, supply clock signals. If the first input terminal of an AND-gate is driven by a first data signal and the second input terminal of the AND-gate is driven by a second data signal, the AND-gate output signal is a data signal. Note, the first data signal and the second data signal may be the same signal in this and the following definitions. The important aspect is that a data signal drives each of the two input terminals. If the first input terminal of an AND-gate is driven by a first clock signal and the second input terminal of the AND-gate is driven by a second clock signal, the AND-gate output signal is a clock signal. If the first input terminal of an AND-gate is driven by a clock signal and the second input terminal of the AND-gate is driven by a data signal, the AND-gate output signal is a data signal if a flip-flop data pin is in the transitive fanout of the AND-gate. In this case, the AND-gate is referred to as "a clocked-gate." If the first input terminal of an AND-gate is driven by a clock signal and the second input terminal of the AND-gate is driven by a data signal, the AND-gate output signal is a clock signal if a flip-flop data pin is not in the transitive fanout of the AND-gate. In this case, the AND-gate is referred to as "a gated-clock."

The previous data and clock signal definitions are the same if the combinational primitive element is an OR gate. If the first input terminal of an OR-gate is driven by a first data signal and the second input terminal of the OR-gate is driven by a second data signal, the OR-gate output signal is a data signal. If the first input terminal of an OR-gate is driven by a first clock signal and the second input terminal of the OR-gate is driven by a second clock signal, the OR-gate output signal is a clock signal.

If the first input terminal of an OR-gate is driven by a clock signal and the second input terminal of the OR-gate is driven by a data signal, the OR-gate output signal is a data signal if a flip-flop data pin is in the transitive fanout of the OR-gate. In this case, the OR-gate is referred to as "a clocked-gate." If the first input terminal of an OR-gate is driven by a clock signal and the second input terminal of the OR-gate is driven by a data signal, the OR-gate output signal is a clock signal if a flip-flop data pin is not in the transitive fanout of the OR-gate. In this case, the OR-gate is referred to as "a gated-clock."

Thus, the important aspect for a clocked-gate and a gated-clock is not the particular combinational primitive element used, but rather whether a synchronous element data pin is in the transitive fanout of the combinational primitive element. While the above definitions are given with respect to a flip-flop, one-skilled in the art will appreciate that the definitions are equally applicable for any synchronous primitive element, e.g., a latch.

According to the principles of this invention, each synchronous primitive element, each of the selected combinational elements, and each external primitive elements are all represented in a static timing verification system by a universal synchronization element that has a propagation time interval and a stable time interval characteristic that are the same as that particular element. Thus, to demonstrate the application of this method, each of the various elements are considered in detail below. For each of these elements, the selection of the appropriate stable and propagation intervals is explained.

Unlike prior art methods, that used a different ideal element for each different circuit element, this method uses the same universal synchronization element for all circuit elements. The timing characteristics of the universal synchronization element are adjusted for each different circuit element so that it accurately reflects the timing characteristics of that particular circuit element. This not only greatly simplifies the static timing verification representation, but also provides greater accuracy than was possible with the prior art methods.

Figure 6:
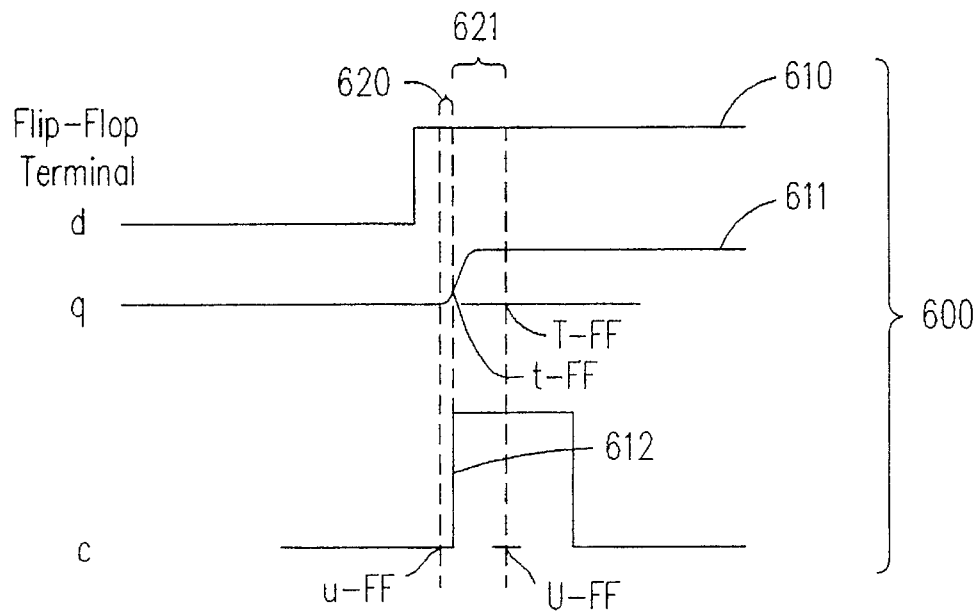
FIG. 6 is a timing diagram for the flip-flop of FIG. 2 as well as an illustration of the signal propagation characteristics and the stable characteristics of the universal synchronization element of this invention when the element is substituted in a static verification timing system for the flip-flop.

To represent positive edge-triggered D-type flip-flop 200 (FIG. 2), input signal 610 (FIG. 6) on data input terminal "d" must be stable a short time period before the initiation of a rising clock edge 612 on clock input terminal "c", the setup requirement 620, sometimes called "setup time interval 620," and input signal 610 must remain stable for a short time period after the initiation of rising clock edge 612, the hold requirement 621, sometimes called "hold time interval 621". Input signal 620 propagates to output terminal "q" during hold time interval 621.

To use universal synchronization element 500 of this invention to represent flip-flop 200, propagation time means 520 is configured so that the time interval between propagation start time t-FF (FIG. 6) and propagation end time T-FF is equivalent to hold time interval 621. Specifically, the signal propagation capability of universal synchronization element 500 is enabled by rising edge 612 at propagation start time t-FF and disabled at propagation end time T-FF. Consequently, universal synchronization element 500 (FIG. 5) permits the input signal on input terminal D to propagate to output terminal Q and consequently output terminal O only during the propagation time interval between propagation start time t-FF and propagation end time T-FF.

Stable time means 510 is configured so that setup time interval 620 (FIG. 6) plus hold time interval 621 of flip-flop 200 corresponds to the stable time interval between stable start time u-FF and stable end time U-FF, i.e., the time just before rising edge 612 to just after rising edge 612. Note that times t-FF and T-FF and times u-FF and U-FF are determined by the target technology used to implement the digital circuit and the particular type of flip-flop. Therefore, these times are known once the target technology and the particular type of flip-flop are specified.

Thus, the timing constraints associated with flip-flop 200, i.e., (i) a specific edge of the clock signal;

(ii) a setup requirement and the associated clock edge; and (iii) a hold requirement and the associated clock edge are fully met with universal synchronization element 500 of this invention because the operation of propagation time means 520 is referenced to a specific edge of the clock signal and the operation of stable time means 510 satisfies constraints (ii) and (iii). Thus, with these constraints, universal synchronization element 500 of this invention functions for static timing verification as positive edge-triggered D-type flip-flop 200.

In view of the previous discussion of using universal synchronization element 500 to represent flip-flop 200, the representation of a negative edge-triggered D-type flip-flop with universal synchronization element 500 will be apparent to those skilled in the art. Each of the considerations is the same as described above with the rising clock edge replaced with a falling clock edge. Thus, universal synchronization element 500 may be used to represent both positive and negative edge-triggered flip-flops.

Figure 7:
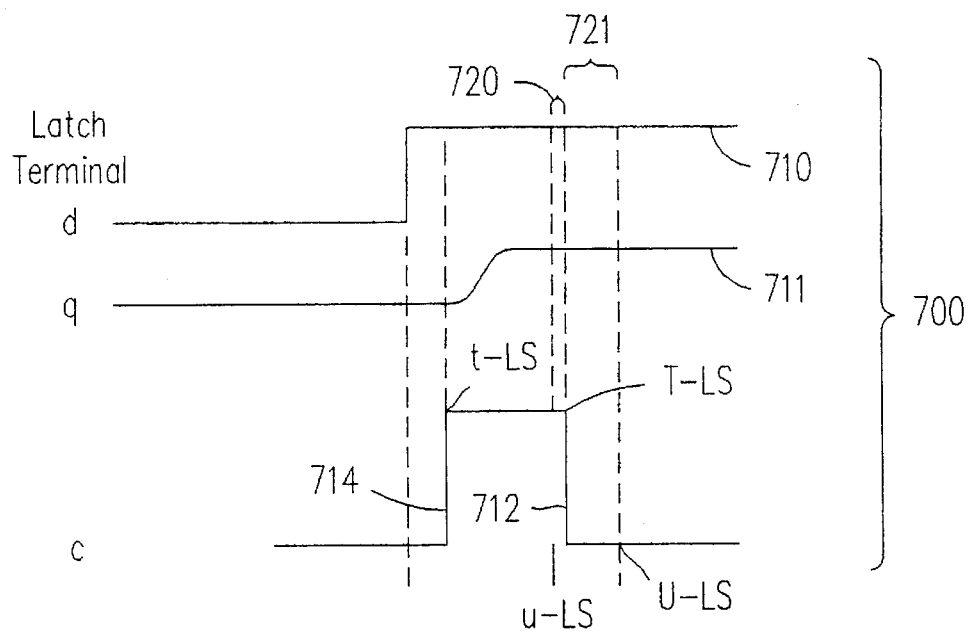
FIG. 7 is a timing diagram for the latch of FIG. 3 as defined herein as well as an illustration of the signal propagation characteristics and the stable characteristics of the universal synchronization element of this invention when the element is substituted in a static verification timing system for the latch.

To represent a positive level-sensitive D-type latch 300 (FIG. 3), input data signal 710 (FIG. 7) on input terminal "d" must be stable a short time interval 720 before a falling clock edge 712 the "setup requirement", and input data signal 710 must remain stable until a short time interval 721 after the falling clock edge, the "hold requirement". From the time of rising clock edge 714 to the time of falling clock edge 712, input data signal 710 propagates to output terminal "q" of latch 300.

To use universal synchronization element 500 of this invention to represent latch 300, propagation time means 520 is configured so that propagation start time t-LS is coincident with a rising clock edge and propagation end time T-LS is coincident with a falling clock edge. Specifically, the signal propagation capability of element 500 (FIG. 5) is enabled by the rising clock edge at propagation start time t-LS (FIG. 7) and disabled by the falling clock edge at propagation end time T-LS. Thus, during this propagation time interval, input signal 710 on input terminal D of universal synchronization element 500 propagates to output terminal Q and in turn to output terminal O of universal synchronization element 500.

Stable time means 510 is configured so that setup time interval 720 plus hold time interval 721 of latch 300 corresponds to the time interval between stable start time u-LS and stable end time U-LS, i.e., the time just before falling edge 712 of the clock signal to the time just after falling edge 712 when the input signal on input terminal D of universal synchronization element 500 is latched on output terminal Q. Note that times t-LS and T-LS and times u-LS and U-LS are determined by the target technology used to implement the digital circuit, and the particular type of latch. Therefore, these times are known quantities once the target technology and latch type are specified.

Thus, the timing constraints associated with latch 300, i.e., (i) an interval of time during which data can propagate from the input data terminal to the output data terminal;

(ii) a setup requirement and the associated clock edge; and (iii) a hold requirement and the associated clock edge. are fully met with universal synchronization element 500 of this invention because the operation of propagation time means 520 satisfies constraint (i) and the operation of stable time means 510 satisfies constraints (ii) and (iii). Thus, with these constraints, universal synchronization element 500 of this invention functions for static timing verification as latch 300.

In a synchronous digital circuit, as defined above, a clock signal may be combined with a data path in one combinational primitive element and the output signal of the combinational primitive element used at the clock terminal of a latch or flip-flop. In the static timing verification system, all combinational primitive elements, in this embodiment, are represented in terms of the primitive Boolean functions AND, OR, and NOT. Thus, to represent a gated-clock using universal synchronization element 500 of this invention requires only the consideration of the interaction between a clock signal and a data signal at an AND gate and at an OR gate.

When a clock signal 811 is combined with a data signal 810 in an AND gate 801 (FIG. 8A), according to the principles of this invention, data signal 810 is used only to mask certain clock pulses and is not used to change the clock pulse width or to produce extra clock pulses. Consequently, when clock signal 811 is high, all data input signals 810 to AND gate 801 must be stable. Thus, all data input signals 810 to AND gate 801 may change only when clock signal 811 is low.

From a static timing verification standpoint, a simplification based on practice is that clock signal 811 may affect timing performance only when clock signal 811 passes unimpeded through AND gate 801. Thus, when static timing verification system represents a gated-clock with universal synchronization element 500 (FIG. 8B), the clock signal from buffer 501 is passed directly to output terminal O. Propagation time means 520 is not utilized because the propagation time interval through AND gate 801 is captured by the propagation time interval through buffer 501. Thus, the propagation start and end times may be set to the same instant in time.

However, as discussed above, the stability of data input signal 810 on input terminal D of universal synchronization element 500 is critical. Therefore, stable time means 510 is used to check that data input signal 810 is stable from stable start time u-GC, which corresponds to rising edge 813, for example, of clock signal 811 to stable end time U-GC, which corresponds to falling edge 814, for example, of clock signal 811. More generally, stable time means 510 assures that the data input signal to element 500 is stable when the clock signal is high. Note that the output signal on terminal Q of universal synchronization element 500 is not utilized.

Figure 8A:
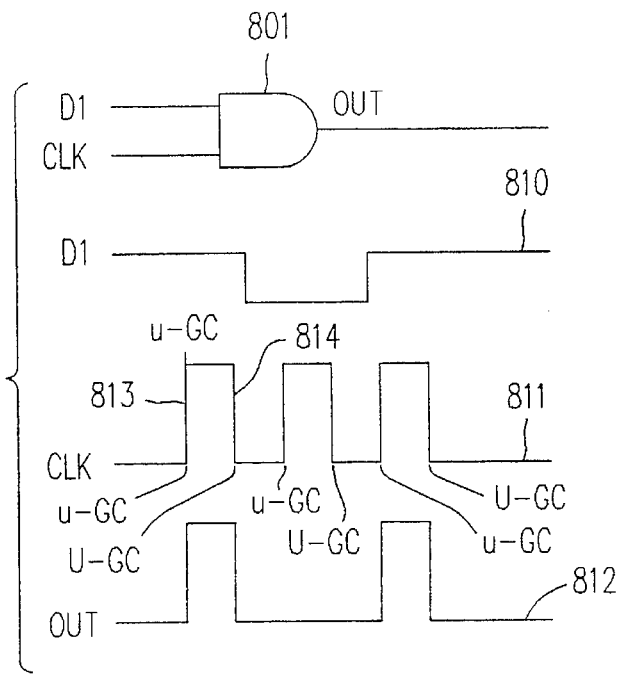
FIG. 8A is a schematic diagram of a gated-clock and the timing diagrams for the gated-clock as defined herein as well as an illustration of the signal propagation characteristics and the stable characteristics of the universal synchronization element of this invention when the element is substituted in a static verification timing system for the gated-clock.
Figure 8B:
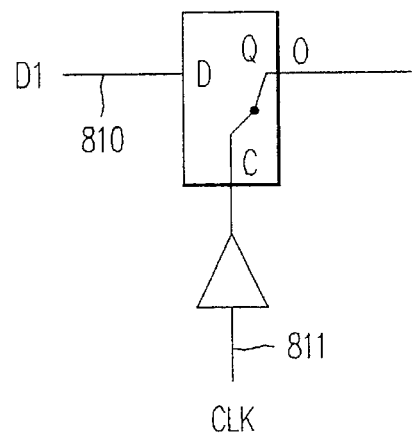
FIG. 8B is a block diagram of the universal synchronization element of this invention configured to represent the gated-clock of FIG. 8A.

Thus, with stable time means 510 functioning as just described, universal synchronization element 500 (FIG. 8B) represents AND gated-clock 801 (FIG. 8A). Of course, some AND gated-clocks may be used by the circuit designer to perform functions other than masking clock pulses. Consequently, any static timing verification system that utilizes universal synchronization element 500 for gated-clocks must require the user to designate the gated-clocks that are used only to mask clock pulses.

When a clock signal is processed with a data signal in an OR gate, according to the principles of this invention, all data input signals to the logic OR gate must be stable when the clock signal is low. Thus, all data input signals to the logic OR gate may change only when the clock signal is high. For an OR gated-clock, the static timing verification system represents the OR gated-clock with universal synchronization element 500 and the clock signal from buffer 501 is passed directly to output terminal O. Propagation time means 520 is again not utilized because the propagation time interval through the OR gate is represented by the propagation time interval through buffer 501. However, as discussed above, the stability of the data input signal on input terminal D of universal synchronization element 500 is critical. Therefore, stable time means 510 is used to check that the data input signal is stable from stable start time u-GC, which corresponds to the fall edge of the clock signal, to stable end time U-GC, which corresponds to the rising edge of the clock signal, i.e., when the clock signal is low.

Figure 9A:
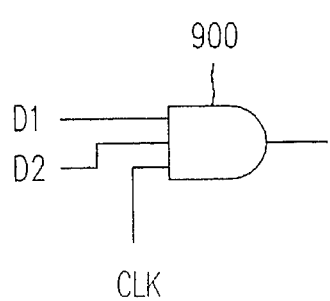
FIG. 9A is a schematic diagram of a clocked-gate as defined herein.

When a gate is clocked (FIG. 9A), the clock signal is used to break the data path during certain times, according to the principles of this invention. Again, since a basic assumption is that the static timing verification system represents the combinational logic in terms of combinational primitive gates, i.e., AND and OR logic gates, and inverters, only a clocked AND gate and a clocked OR gate are considered.

Figure 9B:
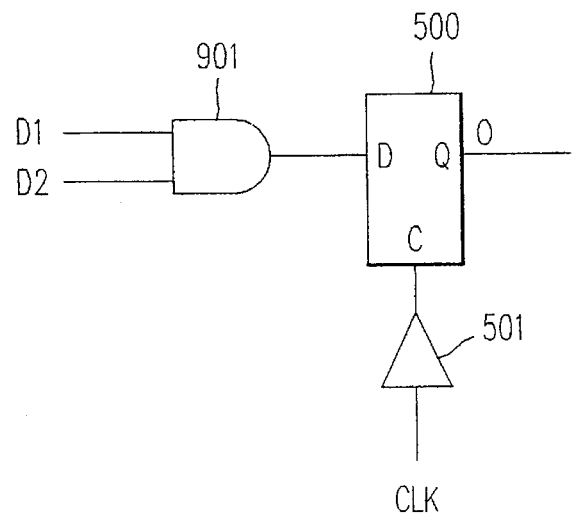
FIG. 9B is a block diagram of the universal synchronization element of this invention configured to represent the clocked-gate of FIG. 9A.

For a clocked AND gate 900 with two data input signals D1, D2 and a clock input signal CLK, data is propagated on the data path only when clock signal CLK is high. To use universal synchronization element 500 (FIG. 9B) of this invention to represent clocked AND gate 900, data signals D1 and D2 drive AND gate 901 and the output signal of AND gate 901 drives input terminal D of universal synchronization element 500 through buffer 501. Clock signal CLK drives clock terminal C of element 500. Propagation time means 520 is configured so that propagation start time t-CG is coincident with the rising clock edge and propagation end time T-CG is coincident with the falling clock edge. Specifically, the input signal is allowed to propagate through element 500 by propagation time means 520 only when clock signal CLK is high. Thus, the data input signal from logic gate 901 propagates from input terminal D to output terminal Q which is connected to output terminal O, when clock signal CLK is high.

Since the stable period is not critical for a clocked AND gate, stable start time u-CG and stable end time U-CG for stable time means 510 are the same instance in time and correspond to the falling edge of clock signal CLK so that element 500 latches the output signal at the instance of the falling clock edge. Thus, universal synchronization element 500 is effectively configured as a level-sensitive latch with special timing characteristics to represent clocked AND gate 900. Notice that this representation is logically incorrect because the output signal of element 500 should go to zero when the clock signal goes low.

For a clocked OR gate, data is propagated on the data path only when the clock signal is low. Thus, to use universal synchronization element 500 of this invention to represent a clocked OR gate, propagation time means 520 is configured so that propagation start time t-CG is coincident with the falling clock edge and propagation end time T-CG is coincident with the rising clock edge. Thus, the data input signal propagates from input terminal D to output terminal Q whenever the clock signal is low. Since the stable time characteristics is not critical for a clocked OR gate, stable start time u-CG and stable end time U-CG in stable time means 510 are the same instance in time and correspond to the rising edge of the clock signal so that the signal is effectively latched on the output terminal at the time of the rising clock edge.

Input ports to the synchronous digital circuit are also represented using universal synchronization element 500 of this invention. The input signal supplied by an input port is valid for certain periods of time and invalid at other periods of times. The period for each input signal is known and is specified for the static timing verification system. The period of the input signal is a key aspect in using universal synchronization element 500 to represent the input port.

Figure 10A:
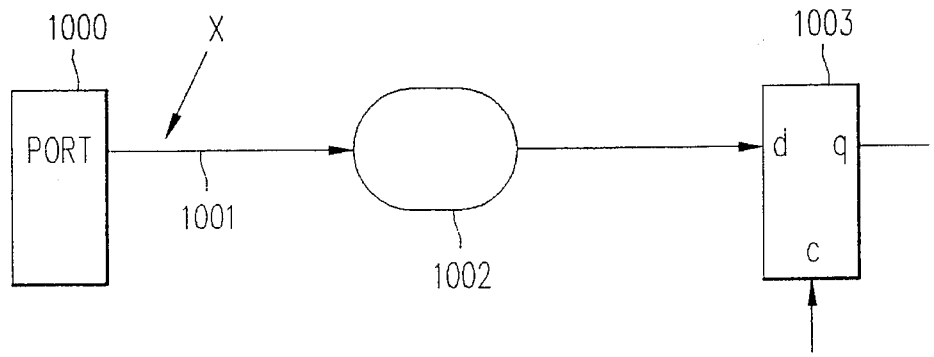
FIG. 10A is a representation of a synchronous digital circuit input port as defined herein.
Figure 10B:
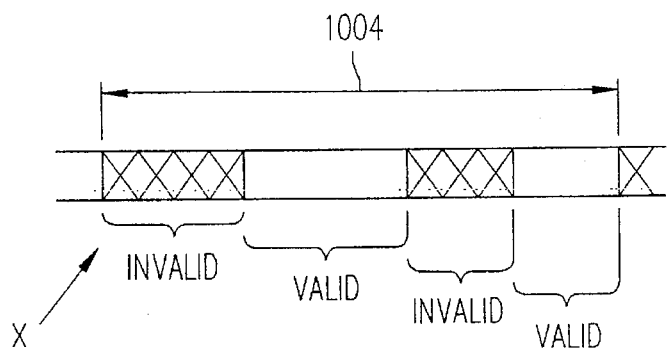
FIG. 10B is a timing diagram for the input port of FIG. 10A that illustrates the times when the input signal from the input port is valid and invalid as well as the period of the input signal.
Figure 10C:
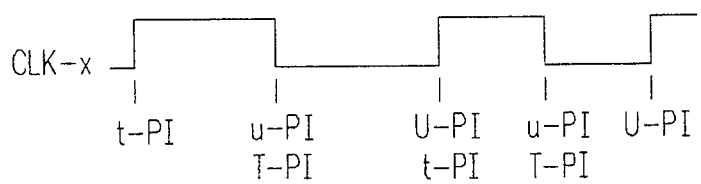
FIG. 10C is a timing diagram of the clock signal that drives the clock terminal of the universal synchronization element of this invention when the element is substituted in a static verification timing system for the input port.
Figure 10D:
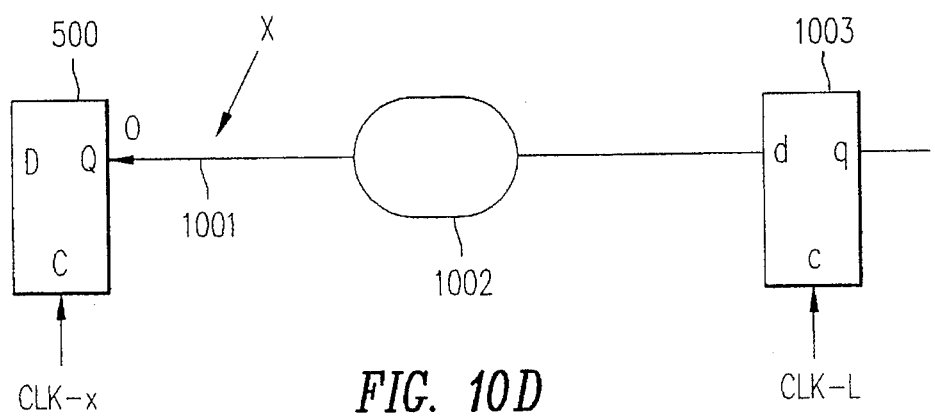
FIG. 10D is a representation of the synchronous digital circuit input port of FIG. 10A with the universal synchronization element of this invention substituted in the static verification timing system for the input port.

FIG. 10A illustrates an input signal line 1001 from input port 1000 to combinational logic circuit 1002, which in response to an input signal "x" generates an input signal to latch 1003 which is clocked by clock signal CLK-L. FIG. 10B is a timing diagram that illustrates when input signal "x" on line 1001 is valid and invalid as well as period 1004 of input signal "x". FIG. 10C one period of a clock waveform CLK-x that represents input signal "x." Notice that when clock signal CLK-x is high, input signal "x" is invalid and conversely.

According to the principles of this invention, output terminal O of universal synchronization element 500 drives input line 1001. Clock signal CLK-x drives clock terminal C of universal synchronization element 500. Propagation time means 520 is configured so that input signal "x" propagates when input signal "x" is invalid. Thus, propagation start time t-PI corresponds to a rising edge of clock signal CLK-x and propagation end time T-PI corresponds to a falling edge of clock signal CLK-x. Stable time means 510 is configured so that the output signal on terminal O from terminal Q is stable when input signal "x" is valid. Thus, stable start time u-PI corresponds to propagation end time T-PI, which corresponds to the falling edge of clock signal CLK-x, and stable end time U-PI corresponds to the rising edge of clock signal CLK-x. Thus, universal synchronization element 500, in this embodiment, is effectively configured as a latch that propagates the input signal when the input signal is invalid and then latches and holds the input signal while the input signal is valid.

Output ports of the synchronous digital circuit are also represented using universal synchronization element 500 of this invention. Since the circuit is synchronous, an output signal to an output port is harmonically related to some clock signal for the synchronous digital circuit. Further, each output signal to an output port is required to be valid during part of a clock period and invalid during another part of the period. The period for each output signal is also known and is specified for the static timing verification system.

Figure 11A:
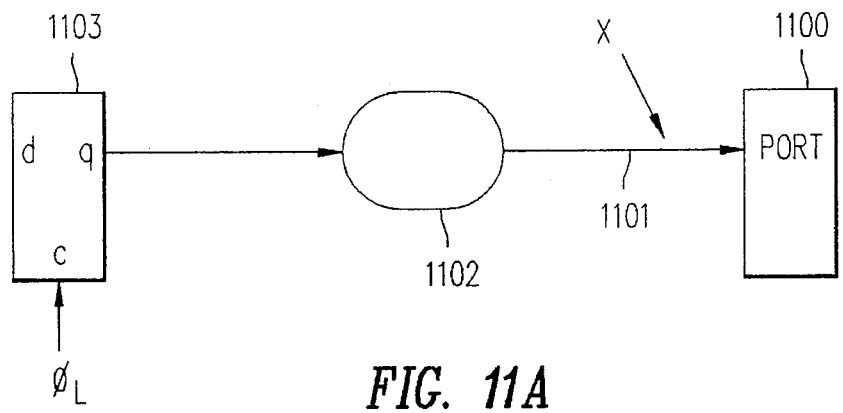
FIG. 11A is a representation of a synchronous digital circuit output port as defined herein.
Figure 11B:
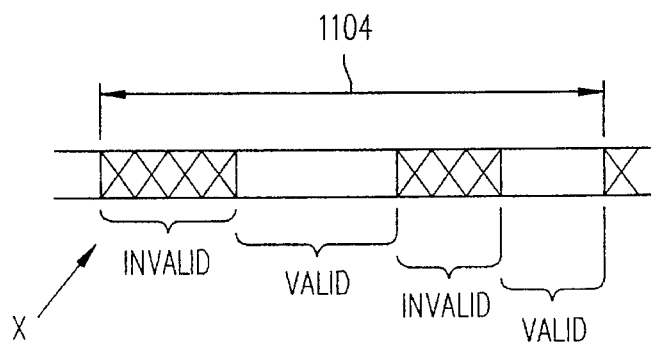
FIG. 11B is a timing diagram for the output port of FIG. 11A that illustrates the times when the output signal to the output port is valid and invalid as well as the period of the output signal.

FIG. 11A illustrates port 1100 that receives an output signal "x" on line 1101 that is driven by combinational logic circuit 1102 which in turn is driven by the output signal of latch 1103 which is clocked by clock signal CLK-L. FIG. 11B is a timing diagram that illustrates when output signal "x" on line 1101 is valid and invalid as well as period 1104 of output signal "x".

Figure 11C:
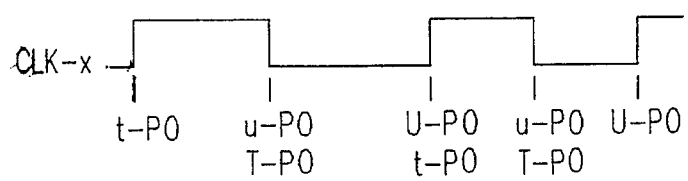
FIG. 11C is a timing diagram of the clock signal that drives the clock terminal of the universal synchronization element of this invention when the element is substituted in a static verification timing system for the output port.
Figure 11D:
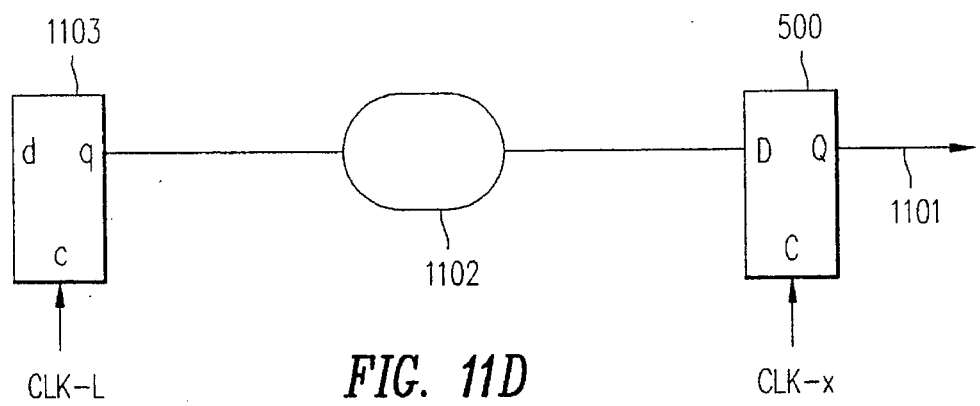
FIG. 11D is a representation of the synchronous digital circuit output port of FIG. 11A with the universal synchronization element of this invention substituted in the static verification timing system for the output port.

According to the principles of this invention, and the output signal from combinational logic circuit 1102 on line 1101 (FIG. 11D) drives input terminal D of universal synchronization element 500. Clock signal CLK-x drives clock terminal C of universal synchronization element 500. Propagation time means 520 is configured so that output signal "x" propagates through universal synchronization element 500 when output signal "x" is invalid. Thus, propagation start time t-PO corresponds to a rising edge of clock signal CLK-x (FIG. 11C) and propagation end time T-PO corresponds to a falling edge of clock signal CLK-x. Stable time means 510 is configured so that the output signal on terminal O from terminal Q is stable when output signal "x" is valid. Thus, start time u-PO corresponds to propagation end time T-PO, (FIG. 11C) which corresponds to the falling edge of clock signal CLK-x, and end time U-PO corresponds to the rising edge of clock signal CLK-x.

Universal synchronization element 500 may be used in a wide variety of static timing verification systems and consequently in computer processes in a wide variety of computer systems. For example, universal synchronization element 500 can be used in a timing verification system running on a workstation such as the one sold by Sun Microsystems of Palo Alto, Calif. as model Sparc Station 1.

Universal synchronization element 500 can be implemented in a static timing verification system in a variety of ways. For example, universal synchronization element 500 could be directly substituted for external primitive elements, combinational primitive elements having either synchronous timing behavior or synchronous timing constraints and synchronous primitive elements. Again there are a variety of ways to effect the direct substitution. For example, data structures representing a circuit could be copied and then modified to reflect the substitution.

Alternatively, effective substitution is used in the static timing verification system. In this case, as the data structures for the user's circuit are traversed, the substitution of the universal synchronization element is performed on the fly as the static timing verifier traverses the user's circuit without permanently modifying the data structures representing the user's circuit. The actual data structure for a circuit element is switched with a hierarchical macro-model of the universal synchronization element which provides an efficient means to realize the direct substitution. This technique, however avoids copying the data structure of the circuit net-list, and hence reduces both the computer time and memory usage required for the static timing verification.

The incorporation of universal synchronization element 500 into existing static timing verification systems will be apparent to those skilled in the art in view of the above disclosure. The use of a single basic structure for representing the circuit elements in a synchronous digital circuit simplifies the static timing verification while at the same time providing enhanced capability over prior art ideal structures used in static timing verification systems.

The embodiments described above of the universal synchronization element of this invention are illustrative only of the principles of this invention and are not intended to limit the invention to the specific embodiments disclosed. In view of this disclosure, those skilled in the art will be able to use the universal synchronization element for more complex flip-flops, latches and gates which are combinations of the embodiments described above with combinational logic. T-type flip-flops, J-K edge triggered flip-flops, masterslave two-clock flip-flops, multi-bit registers can all be represented as net lists of the synchronization and combinational elements described above. Also, the principals described above are equally applicable to negative edge triggered flip-flops and negative level sensitive latches. Moreover, the basic method of using an appropriate propagation time interval and an appropriate stable time interval for each circuit element in a synchronous circuit for static timing verification extends not only the circuits for which static timing verification is appropriate but also improves the accuracy of the static timing verification results.

We claim:

1. In a computer based static timing verification system, a method comprising:

defining for each synchronous primitive element in a synchronous digital circuit, a universal synchronization element having a signal propagation time interval and a signal stable time interval wherein said propagation time interval and said signal stable time interval are a propagation time interval and a signal stable time interval, respectively, of that synchronous primitive element wherein a set of universal synchronization elements is defined; and representing said synchronous digital circuit in said static timing verification system by representing each synchronous primitive element in said synchronous digital circuit with a corresponding universal synchronization element wherein said corresponding universal synchronization element has the signal propagation time interval and the signal stable time interval as that of the synchronous primitive element; and said corresponding universal synchronization element is selected from said set of universal synchronization elements.

2. In a computer based static timing verification system, the method as in claim 1 wherein each synchronous primitive element includes a data input terminal, a data output terminal and a clock terminal.

3. In a computer based static timing verification system, the method as in claim 1 wherein one synchronous primitive element in said synchronous digital circuit comprises a flip-flop.

4. In a computer based static timing verification system, the method as in claim 3 wherein said flip-flop comprises a positive edge-triggered flip-flop.

5. In a computer based static timing verification system, the method as in claim 3 wherein one synchronous primitive element in said synchronous digital circuit comprises a latch.

6. In a computer based static timing verification system, the method as in claim 5 wherein said latch comprises a positive level-sensitive latch.

7. In a computer based static timing verification system, the method as in claim 1 further comprising:

defining for a combinational primitive element in said synchronous digital circuit, a universal synchronization element having a signal propagation time interval and a signal stable time interval;

wherein said propagation time interval and said signal stable time interval are a propagation time interval and a signal stable time interval, respectively, of that selected combinational primitive element;

said combinational primitive element is a combinational primitive element (i) which has a clock signal as an input signal and (ii) which affects timing performance of said synchronous digital circuit; and representing said combinational primitive element in said synchronous digital circuit in said static timing verification system with a universal synchronization element having a signal propagation time interval and a signal stable time interval that are characteristic of the combinational primitive element.

8. In a computer based static timing verification system, the method as in claim 7 wherein said combinational primitive element includes an input terminal and an output terminal.

9. In a computer based static timing verification system, the method as in claim 7 wherein said combinational primitive element comprises a gated-clock.

10. In a computer based static timing verification system, the method as in claim 9 wherein said gated-clock comprises an AND gated-clock.

11. In a computer based static timing verification system, the method as in claim 9 wherein said gated-clock comprises an OR gated-clock.

12. In a computer based static timing verification system, the method as in claim 7 wherein said combinational primitive element comprises a clocked-gate.

13. In a computer based static timing verification system, the method as in claim 12 wherein said clocked-gate comprises a clocked-AND gate.

14. In a computer based static timing verification system, the method as in claim 13 wherein said clocked-gate comprises a clocked-OR gate.

15. In a computer based static timing verification system, the method as in claim 1 further comprising:

defining for each external primitive element in said synchronous digital circuit, a universal synchronization element having a signal propagation time interval and a signal stable time interval wherein said propagation time interval and said signal stable time interval are a propagation time interval and a signal stable time interval, respectively, of that external primitive element; and representing each external primitive element in said synchronous digital circuit with a corresponding universal synchronization element in said static timing verification system wherein said corresponding universal synchronization element has a signal propagation time interval and a signal stable time interval that are characteristic of the external primitive element.

16. In a computer based static timing verification system, the method as in claim 15 wherein one external primitive element in said synchronous digital circuit comprises an input port.

17. In a computer based static timing verification system, the method as in claim 15 wherein one external primitive element in said synchronous digital circuit comprises an output port.

18. In a computer based static timing verification system, a method for uniformly characterizing signal timing behavior of synchronous primitive elements, selected combinational primitive elements, and external primitive elements in a synchronous digital circuit comprising:

using for each synchronous primitive element, each selected combinational primitive element, and each external primitive element in said synchronous digital circuit, a signal propagation start time and a signal propagation end time for characterizing a time interval during which that primitive element allows transfer of a signal; and using a signal stable start time and a signal stable end time for characterizing a time interval during which that primitive element requires a stable signal level wherein said signal propagation start and end times and said signal stable start and end times are used in said static timing verification system to uniformly characterize a signal timing behavior of that primitive element.

19. In a computer based static timing verification system, the method of claim 18 further comprising:

defining the signal propagation start and end times with respect to a clock signal for said primitive element.

20. In a computer based static timing verification system, the method of claim 19 further comprising the step:

defining the signal stable start and end times with respect to a clock signal for said primitive element.

21. In a computer based static timing verification system, the method of claim 18 further comprising:

defining the signal stable start and end times with respect to a clock signal for said primitive element.

22. In a computer based static timing verification system, the method as in claim 18 wherein each synchronous primitive element includes a data input terminal, a data output terminal and a clock terminal.

23. In a computer based static timing verification system, the method as in claim 18 wherein one synchronous primitive element in said synchronous digital circuit comprises a flip-flop having a hold time interval and a setup time interval.

24. In a computer based static timing verification system, the method as in claim 23 wherein said signal propagation start time and said signal propagation end time characterize a time interval equal to said hold interval time.

25. In a computer based static timing verification system, the method as in claim 23 wherein said signal stable start time and said signal stable end time characterize a time interval equal to the sum of said hold time interval and said setup time interval.

26. In a computer based static timing verification system, the method as in claim 18 wherein one synchronous primitive element in said synchronous digital circuit comprises a latch having a setup time interval and a hold time interval.

27. In a computer based static timing verification system, the method as in claim 26 wherein said signal propagation start time is defined by an edge of a clock signal going in a first direction and said signal propagation end time is defined by a subsequent edge of said clock signal going in a second direction wherein said second direction is opposite to said first direction.

28. In a computer based static timing verification system, the method as in claim 26 wherein said signal stable start time and said stable end time characterize a time interval equal to the sum of said hold time interval and said setup time interval.

29. In a computer based static timing verification system, the method as in claim 18 wherein one combinational primitive element in said synchronous digital circuit comprises a logic gate having a data signal on a first input terminal and a clock signal on a second input terminal latch and the output signal of said logic gate is a gated-clock signal.

30. In a computer based static timing verification system, the method as in claim 29 wherein said signal propagation time interval is not utilized and further wherein signal propagation delay through said logic gate is represented by a buffer signal propagation delay.

31. In a computer based static timing verification system, the method as in claim 29 wherein said signal stable start time is coincident with an edge of said clock signal going in a first direction and said stable end time is coincident with an edge of said clock signal going in a second direction wherein said first direction is opposite to said second direction.

32. In a computer based static timing verification system, the method as in claim 31 wherein said logic gate is an AND gate; said first direction is said clock signal going high; and said second direction is said clock signal going low.

33. In a computer based static timing verification system, the method as in claim 32 wherein said logic gate is an OR gate; said first direction is said clock signal going low; and said second direction is said clock signal going high.

34. In a computer based static timing verification system, the method as in claim 18 wherein one combinational primitive element in said synchronous digital circuit comprises a logic gate having a data signal on a first input terminal and a clock signal on a second input terminal latch and the output signal of said logic gate is a clocked-data signal.

35. In a computer based static timing verification system, the method as in claim 34 wherein said signal propagation start time is coincident with an edge of said clock signal going in a first direction and said signal propagation end time is coincident with an edge of said clock signal going in a second direction wherein said first direction is opposite to said second direction.

36. In a computer based static timing verification system, the method as in claim 35 wherein said logic gate is an AND gate; said first direction is said clock signal going high; and said second direction is said clock signal going low.

37. In a computer based static timing verification system, the method as in claim 36 wherein said logic gate is an OR gate; said first direction is said clock signal going low; and said second direction is said clock signal going high.

38. In a computer based static timing verification system, the method as in claim 34 wherein said signal stable start and end times are a single instance in time.

39. In a computer based static timing verification system, the method as in claim 18 wherein one external primitive element in said synchronous digital circuit comprises an input port wherein said input port supplied an input signal that is valid during a first time interval and invalid during a second time interval.

40. In a computer based static timing verification system, the method as in claim 39 wherein said signal propagation time interval is set equal to the second time interval.

41. In a computer based static timing verification system, the method as in claim 39 wherein said stable time interval is set equal to the first time interval.

42. In a computer based static timing verification system, the method as in claim 18 wherein one external primitive element in said synchronous digital circuit comprises an output wherein said output port is supplied an output signal that is valid during a first time interval and invalid during a second time interval.

43. In a computer based static timing verification system, the method as in claim 42 wherein said signal propagation time interval is set equal to the second time interval.

44. In a computer based static timing verification system, the method as in claim 42 wherein said signal stable time interval is set equal to the first time interval.

45. In a computer based static timing verification system, a method for uniformly characterizing the timing behavior of synchronous elements comprising:

representing each of said synchronous elements with an element having signal propagation start and end times equivalent to that synchronous element; and representing signal stable start and end times of a synchronous element with equivalent signal stable start and end times in said element having signal propagation start and end times equivalent to said synchronous element.

* * * * *